(12) United States Patent
Tu

(10) Patent No.: US 9,212,940 B2
(45) Date of Patent: Dec. 15, 2015

(54) VACUUM CAVITY-INSULATED FLOW SENSORS

(76) Inventor: Xiang Zheng Tu, San Jose, CA (US)

( * ) Notice: Subject to any disclaimer, the term of this patent is extended or adjusted under 35 U.S.C. 154(b) by 532 days.

(21) Appl. No.: 13/607,352

(22) Filed: Sep. 7, 2012

(65) Prior Publication Data

US 2014/0069185 A1    Mar. 13, 2014

(51) Int. Cl.
*G01F 1/68* (2006.01)
*G01F 1/688* (2006.01)
*G01F 1/684* (2006.01)
*G01F 1/692* (2006.01)

(52) U.S. Cl.
CPC .............. *G01F 1/688* (2013.01); *G01F 1/6845* (2013.01); *G01F 1/692* (2013.01)

(58) Field of Classification Search
CPC ...... G01F 1/6845; G01F 1/6847; H01L 35/34
USPC .............................. 73/204.23, 204.26; 438/54
See application file for complete search history.

(56) References Cited

U.S. PATENT DOCUMENTS

| | | | |
|---|---|---|---|
| 6,139,758 A * | 10/2000 | Tu ...................................... | 216/2 |
| 6,378,365 B1 * | 4/2002 | Tu ............................... | 73/204.26 |
| 6,622,373 B1 * | 9/2003 | Tu .................................... | 29/611 |
| 8,132,455 B2 * | 3/2012 | Chen et al. ................. | 73/204.26 |

OTHER PUBLICATIONS

Pagonis et al., Porous Silicon Membranes over Cavity for Efficient Local Thermal Isolation in Si Thermal Sensors, Journal of the Electrochemical Society, 2004, 151(8) H174-H179.
Verhoeven et al., An integrated gas flow sensor with high sensitivity, low response time and a pulse rate-output. Sensors and Actuators A, 1994, 41/42, 217-220.
Liu et al. A Micromachined Flow Shear-Stress Sensor Based on Thermal Transfer Principles. Journal of Microelectromechanical Systems, vol. 8, No. 1, Mar. 1999.
Tabata et al. Fast Response Silicon Flow Sensor with a Thermal Isolation Structure, Proceeding of the 5th Sensor Symposium. The Institute of Electrical Engineers of Japan. 1985, pp. 207-211.

* cited by examiner

*Primary Examiner* — Lisa Caputo
*Assistant Examiner* — Nigel Plumb
(74) *Attorney, Agent, or Firm* — James M Wu; JW Law Group

(57) ABSTRACT

A vacuum-cavity-insulated flow sensor and related fabrication method are described. The sensor comprises a porous silicon wall with numerous vacuum-pores which is created in a silicon substrate, a porous silicon membrane with numerous vacuum-pores which is surrounded and supported by the porous silicon wall, and a cavity with a vacuum-space which is disposed beneath the porous silicon membrane and surrounded by the porous silicon wall. The fabrication method includes porous silicon formation and silicon polishing in HF solution.

11 Claims, 4 Drawing Sheets

VACUUM CAVITY-INSULATED FLOW SENSORS

FIELD

The invention relates to a micromachined flow sensor. Particularly, the invention relates to a micromachined vacuum-cavity-insulated flow sensor utilizing a rigid porous silicon membrane as its suspending structure and a micromachined vacuum-cavity as its thermal insulation structure.

BACKGROUND

The micromachined flow sensors are miniaturized mechanical and electro-mechanical devices. They were investigated for their superior characteristics compared to conventional ones due to their small size, increased sensitivity, fast response, and cost effectiveness. Since flow measurement is a classical field of measurement technology, the micromachined flow sensors have found many important applications in several fields, including automotive and aerospace applications, meteorological stations, industrial control equipment, medical equipment, etc. The growing market of the micromachined flow sensors requires a lot of research and development of this new technology and its use for fabrication of flow sensors.

Different types of micromachined flow sensors were published in the literature, most of them being of the thermal type and composed of suspended membranes on top of a cavity, on which the active elements of the sensor are fabricated. These structures offer optimum thermal isolation by the air under the membranes.

Toyota Central Research and Development Laboratories developed a micromachined flow sensor based on the conventional hot-film anemometry. The sensor chip has two platinum thin-film resistors which are used as a heating element and a fluid temperature sensing element. The resistors are located in the centre of the oxidized porous silicon diaphragm and the rim of the chip, respectively. (Tabata, O., Inagaki, H., Igarashi, I. and Kitano, T., Fast, *Proceeding of the 5th Sensor Symposium*, The Institute of Electrical Engineers of Japan, Japan, 1985, pp. 207-211).

It has been shown that porous silicon oxidation causes marked wafer warpage, breaking up membrane during their release while etching Si from the back side, and formation of membranes with a blister-like shape immediately after the cooling step from the oxidation temperature to room temperature.

Delft University of Technology (Netherlands) manufactured a flow sensor for measuring flow rate and flow direction was developed. In these sensors, thermopiles consisting of silicon-aluminum coupling in a two-dimensional arrangement are in use. The heater resistor is located on a suspended thin silicon plate for improvement of the heat isolation. (Verhoeven H. J. and Huijsing, J. H., An integrated gas flow sensor with high sensitivity, low response time and pulse-rate output. *Sensors and Actuators A,* 1994, 41/42, 217-220).

It is not common to use a suspended silicon membrane as thermal insulation. Since the thermal conductivity of silicon is relatively high, the improvement of the heat isolation is limited.

D. N. Pagonis et al. provided a micromachined flow sensor using a manufacturing technique for forming an air cavity below the porous layer to increase the thermal isolation efficiency. Both porous silicon and the cavity underneath are formed during the same electrochemical process in two steps: in step 1 the current density used is below a critical value, and in step 2 it is switched to a value above the critical current for electropolishing. In this way, porous silicon is formed first, followed by the formation of the cavity underneath. (D. N. Pagonis, A. G. Nassiopoulou, and G. Kaltsas, Porous silicon membranes over cavity for efficient local thermal isolation in Si thermal sensors, *Journal of The Electrochemical Society,* 151(8) H174-H179 (2004))

Unfortunately, the created porous silicon layer is easy to detach from the silicon substrate. To overcome this problem an n-type silicon bar is created in a p-type silicon substrate by thermal diffusion. The porous silicon layer is created in the p-type region surrounded by the n-type silicon bar and supported not only by the masking layer but also by the n-type silicon bar. In this process, a P implantation dose of 2 by 10 sup.16/square cm is required. In addition, three consecutive oxidation steps are followed and the oxide formed in each oxidation is removed. This process is not compatible with a CMOS process. The obtained PS membrane is only 10 um-thick, it is too fragile for most of flow measurements.

Chang Liu et al. proposed a micromachined flow sensor consisting of a suspended silicon-nitride diaphragm located on top of a vacuum-sealed cavity. A heating and heat-sensing element, made of polycrystalline silicon material, resides on top of the diaphragm. The underlying vacuum cavity greatly reduces conductive heat loss to the substrate and therefore increases the sensitivity of the sensor (Chang Liu, *Member, IEEE*, Jin-Biao Huang, Zhenjun (Alex) Zhu, Fukang Jiang, Steve Tung, Yu-Chong Tai, and Chih-Ming Ho, A Micromachined flow shear-stress sensor based on thermal transfer principles, *JOURNAL OF MICROELECTROMECHANICAL SYSTEMS*, VOL. 8, NO. 1, MARCH 1999)

A drawback is that the fabricated sensor is also sensitive to changes of ambient pressure because the suspended silicon-nitride diaphragm is flexible and the heavily doped polysilicon serves as a piezoresistive element.

The U.S. Pat. No. 6,378,365 (Micromachined thermal flowmeter having heating element disposed in a silicon island; by Tu) revealed a micromachined thermal flowmeter comprising characteristically at least one crystal silicon island jutted into the flow of a fluid to be determined which are embedded in an elastic low thermal conductivity layer supported by a rigid low thermal conductivity plate having a heating element and a pair of thermal sensing elements formed therein.

This U.S. Patents provided micromachined flowmeters that can work robustly in a dirty flow fluid without being disrupted for improved work efficiency.

The U.S. Pat. No. 6,139,758 (Method of manufacturing a micromachined thermal flowmeter; by Tu) teaches a method of manufacturing a micromachined thermal flowmeter. The major manufacturing steps comprise forming an n-type region(s) in a p-type silicon wafer, forming heating and temperature sensing devices in the n-type region(s), converting the n-type region(s) into porous silicon by anodization in a HF solution, bonding the silicon wafer onto a glass plate using a polyimide layer as an adhesive layer, removing the porous silicon in a diluted base solution, and coating the heating and temperature sensing devices with a corrosion-resistant and abrasion-resistant material.

This U.S. Patents developed a thermal isolation technology based on selective formation of a porous silicon layer in a silicon substrate.

Compared to the above mentioned micromachined flow sensors, the vacuum-cavity-insulation flow sensor in the current invention disclosed will present superior properties in many aspects including easiness of fabrication, perfection of thermal isolation, strength of membrane structure, and lower cost of manufacturing.

SUMMARY

In view of the above problems, one embodiment of the present invention provides a vacuum-cavity-insulated flow sensor having the following features:

One feature of the vacuum-cavity-insulated flow sensor provided by the present invention is to create a vacuum-cavity in a silicon substrate so that there is no vertical thermal conduction from a heating element on a suspended porous silicon membrane over the vacuum-cavity to the silicon substrate.

Another feature of the vacuum-cavity-insulated flow sensor provided by the present invention is that the suspended porous silicon membrane is supported by a same thick porous silicon wall so that the detachment of the suspended porous silicon membrane from the silicon substrate is prevented.

Still another feature of the vacuum-cavity-insulated flow sensor provided by the present invention is that the suspended porous silicon membrane is thicker and more rigid so that it is able to withstand at least 7 atm.

Still another feature of the vacuum-cavity-insulated flow sensor provided by the present invention is that the process for fabricating the sensor is simple and compatible with a CMOS process except anodization in HF solution.

Still another feature of the vacuum-cavity-insulated flow sensor provided by the present invention is that the vacuum and sealing of a cavity created in the sensor is automatically realized during a dielectric film deposition process without an additional specific processing step.

Additional features and benefits of the exemplary embodiment(s) of the present invention will become apparent from the detailed description, figures and claims set forth below.

BRIEF DESCRIPTION OF THE DRAWINGS

The exemplary embodiment(s) of the present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

Figure 1:
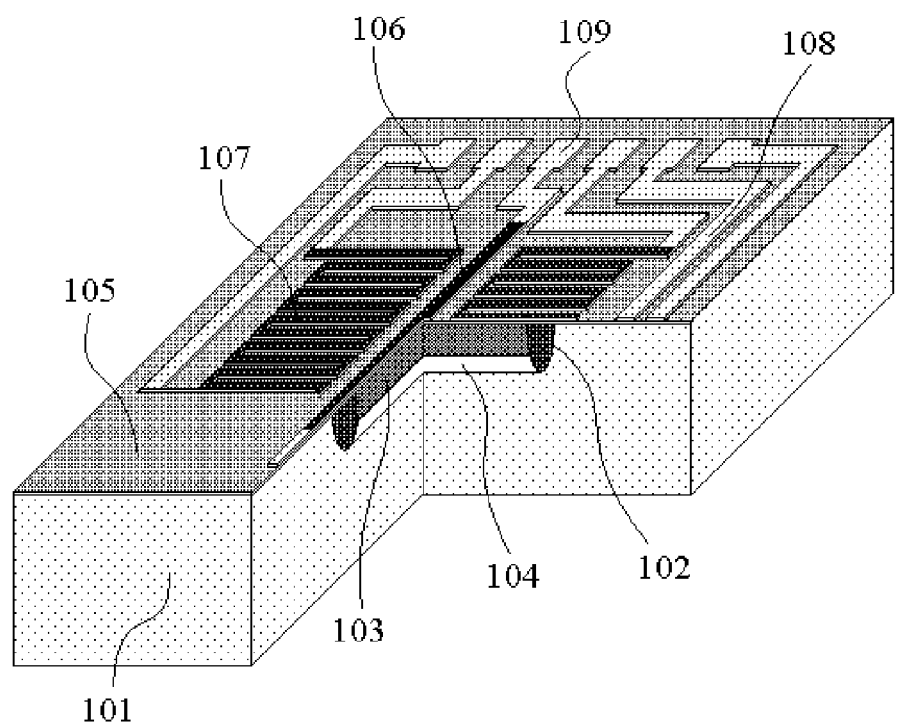
FIG. 1 illustrates the perspective, partially cross-sectional, diagrammatic sketch of a vacuum-cavity-insulated flow sensor in accordance with the present invention.

Referring to FIG. 1, a preferable embodiment of a vacuum-cavity-insulated flow sensor according to the present invention, comprises a single crystal silicon substrate (101), a porous silicon wall with numerous vacuum-pores therein (102) which is disposed in the silicon substrate, a porous silicon membrane with numerous vacuum-pores therein (103) which is surrounded and supported by the porous silicon wall, a cavity with vacuum inside thereof (104) which is disposed under the porous silicon membrane, a dielectric layer (105) deposited on the surface of the silicon substrate which includes the surface of the porous silicon wall and the porous silicon membrane, heating element (106) disposed laterally passing through at the middle of the porous silicon membrane, two temperature sensing elements (107) disposed at two opposite sides of the heating element, and three pairs of metal conducting strips (108) with three pairs of metal bonding pads (109) disposed at three sides of the porous silicon membrane.

According to the present invention, the silicon substrate (101) is heavily doped p-type or n-type single crystal silicon having a resistivity ranging from 0.1 to 0.001 ohm-cm.

The porous silicon wall (102) is created in the silicon substrate (101) and has a resistivity 10 times higher than the silicon substrate. The porous silicon membrane (103) is created in the region surrounded and is supported by the porous silicon wall (102). It should be noted that in the anodization process for forming the porous silicon membrane the porous silicon wall blocks the anodic current flow through therein. So the porous silicon membrane can be surrounded and supported by the porous silicon wall without any laterally extending. The porous silicon wall (102) and the porous silicon membrane (103) have almost a same thickness which ranges from 10 to 60 microns. The width of the porous silicon wall ranges from 20 to 50 microns and the length of the porous silicon membrane ranges from 400 to 2000 microns. The cavity (104) is created under the porous silicon membrane (103). It is also should be noted that the cavity is formed under the porous silicon membrane and the porous silicon wall because the anodic current for forming the cavity is limited to flow from the back side of the silicon substrate to the bottom of the porous silicon membrane and the porous silicon wall without any extending to the outside region of the porous silicon wall. So the edge of the cavity (104) completely disposed under the porous silicon wall (102). The thickness and length of the cavity (104) range respectively from 1 to 20 microns and from 400 to 2000 microns.

It well known that in a vacuum environment there is no thermal conduction to take place because the thermal conductivity of the residual gas therein is zero. It is clear that if a micromachined gap can be drawn into vacuum the heat lost caused by thermal conduction of the micromachined gap can be avoided. Hear said vacuum usually means that the pressure in the micromachined gap is down to 0.001 to 10 Pa.

Generally, the mechanical strength of a porous silicon structure formed by anodization in a HF solution decreases with the porosity of the porous silicon structure. In order to make the porous silicon structure such as a porous silicon membrane to withstand higher pressure, the thickness of the porous silicon structure is preferred to be relatively large but not too much which is reasonable to be 10 to 50 microns.

It is also well known that the thermal conductivity of porous silicon decreases greatly up to 0.002 W/cm K as the porosity is larger than 30% and is almost three orders of the amplitude lower than that of crystal Si~1.56 W/cm K. For thermal insulation application, a thicker porous silicon membrane does not increase heat lost too much, but increase mechanical strength significantly.

The dielectric layer (105) is preferred to be a silicon nitride or a silicon oxide layer. To draw the cavity and the porous silicon membrane into vacuum, the dielectric layer (106) should be formed using a high vacuum deposition technique such as RF-sputtering, high vacuum LPCVD. In these deposition techniques, the working pressure is less than 10 Pa. so that the porous silicon wall (102), the porous silicon membrane (103), and the cavity (104) all can be drawn into vacuum at this process.

It is preferred that the heating element (107) is a resistor such as polysilicon resistor or platinum resistor and the temperature sensing elements (109) are thermopiles or thermistors.

Flow measurements are based on heat exchange between the sensor and the flowing fluid. Under flow, the downstream temperature sensing element is heated up and the upstream temperature sensing element is cooled down. As output signal of the sensor, the difference between the two temperature sensing elements outputs is measured. In this way, the sensitivity of the sensor is improved and any error due to changes of the heater resistance, induced by temperature changes (sensor offset), is minimized.

Referring now to the drawings, from FIG. 2 to FIG. 8, there are cross-sectional views showing a method for fabricating a vacuum-cavity-insulated flow sensor according to the first embodiment of the present invention.

Figure 2:
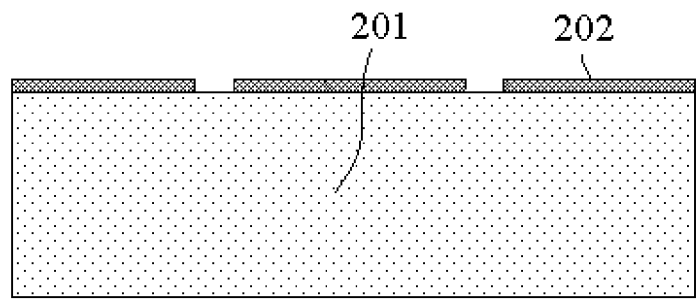
FIG. 2 illustrates the cross-sectional view showing a first silicon-rich silicon nitride masking layer formed on the surface of a silicon substrate which is step 1 for fabricating the vacuum-cavity-insulated flow sensor in accordance with the present invention.

Referring to FIG. 2, a single side polished, crystalline plane (100) oriented p-type silicon wafer (201) with a resistivity ranging from 0.1 to 0.001 ohm-cm is provided. A 3000 Angstroms-thick Si rich silicon nitride layer (202) is deposited on the surface of the wafer (201) by LPCVD (low pressure chemical vapor deposition). A photoresist process is performed to create a first mask pattern with an exposed region having a width ranging from 2 to 10 microns in the silicon nitride layer (202). The shape of the region surrounded by the exposed region is square or rectangular. The unwanted silicon nitride layer is selectively removed by plasma etching.

Figure 3:
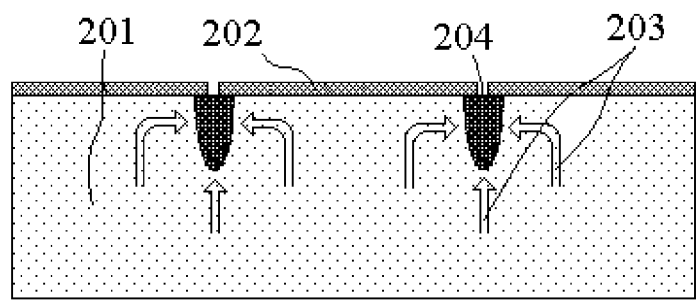
FIG. 3 illustrates the cross-sectional view showing a closed porous silicon wall formed in the silicon substrate which is step 2 for fabricating the vacuum-cavity-insulated flow sensor in accordance with the present invention.

Referring to FIG. 3, in order to make a porous silicon wall (204) in the silicon substrate (201), an anodization process is performed in a HF solution. A double electrochemical cell is used for the anidization process. The used HF solution consists of 49 wt. 49% HF in water and ethanol. The used HF concentration in a HF solution ranges from 12 to 36 wt. %. The used anodic current density ranges from 20 mA to 80 mA/square cm. The resulted the porous silicon wall has a width ranging from 20 to 50 microns and a thickness ranging from 20 to 60 microns. As shown in the figure that during the anodization process an anodic current (203) flow from the back surface of the silicon substrate to the exposed region of the first mask pattern in three different ways: upwards, to-right and to-left. The porous silicon wall (204) is formed also in three directions: downwards, to-left and to-right so that the width of the porous silicon wall is larger than the width of the exposed region of the first mask pattern.

Figure 4:
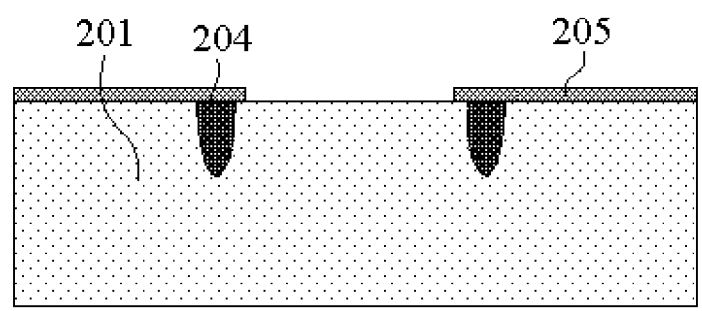
FIG. 4 illustrates the cross-sectional view showing a second silicon-rich silicon nitride masking layer on the silicon substrate which is step 3 for fabricating the vacuum-cavity-insulated flow sensor in accordance with the present invention.

Referring to FIG. 4, another 3000 Angstroms-thick Si rich silicon nitride layer (205) is deposited on the surface of the wafer (201) by LPCVD (low pressure chemical vapor deposition). Then another photoresist process is performed to create a second mask pattern with an exposed region in the silicon nitride layer. It should be noted that the porous silicon wall (204) now is covered by the silicon nitride layer. The exposed region is square or rectangular. The unwanted silicon nitride layer is selectively removed by plasma etching.

Figure 5:
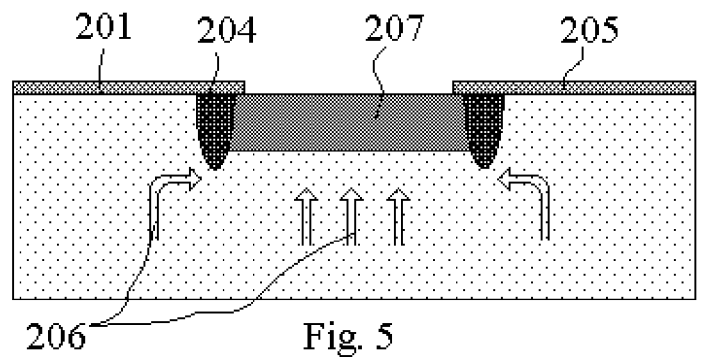
FIG. 5 illustrates the cross-sectional view showing a porous silicon layer formed in the region surrounding by the porous silicon wall which is step 4 for fabricating the vacuum-cavity-insulated flow sensor in accordance with the present invention.

Referring to FIG. 5, another anodization process is performed to form a porous silicon layer (207) in the silicon substrate (201). The used HF solution also consists of 49 wt. 49% HF in water and ethanol. The used HF concentration in a HF solution also ranges from 12 to 36 wt. %. The used anodic current density also ranges from 20 mA to 80 mA/square cm. The resulted porous silicon layer (207) has a thickness ranging from 10 to 60 microns and a length ranging from 400 to 2000 microns. It should be noted that the resistivity of the porous silicon wall (203) is to times as large as the silicon substrate (201). A shown in the figure during the anodization process, the anodic current (206) cannot flow through the porous silicon wall to the exposed region of the nitride layer from the back side of the silicon substrate. So porous silicon can only form in the region surrounding by the porous silicon wall until the thickness of the formed the porous silicon layer to reach the same thick as the porous silicon wall.

Figure 6:
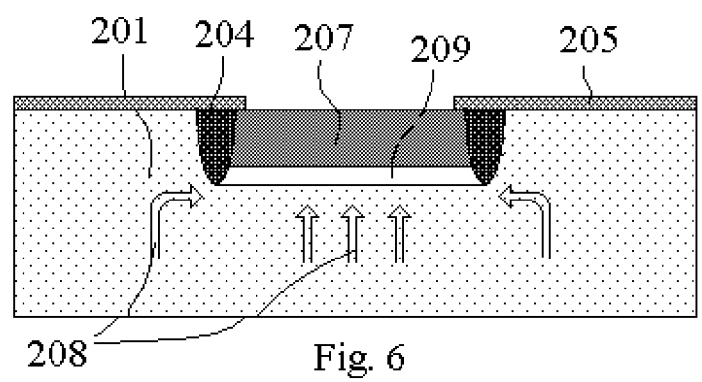
FIG. 6 illustrates the cross-sectional view showing an air filled cavity is created beneath the porous silicon layer so that the porous silicon layer becomes a suspended porous silicon membrane, which is step 5 for fabricating the vacuum-cavity-insulated flow sensor in accordance with the present invention.

Referring to FIG. 6, a cavity (209) is formed by continuing the anodization process performed in FIG. 4. Since the cavity can only be formed in the silicon substrate by silicon electropolishing in HF solution at a higher anodic current density. So the used anodic current density is increased to 100 mA to 500 mA/square cm. But when the anodic current density is too high, it is easy for the porous silicon layer to detach from the silicon substrate, because too much hydrogen gas is produced at the bottom of the porous silicon layer. To overcome this problem, a pulse anodic current is used, which has a pulse width ranging from 10 to 100 ms and a frequency ranging from 1 to 10 Hz.

As shown in the figure the anodic current (208) flow still cannot through the porous silicon wall and the porous silicon layer is limited in the region surrounded by the porous silicon wall.

Figure 7:
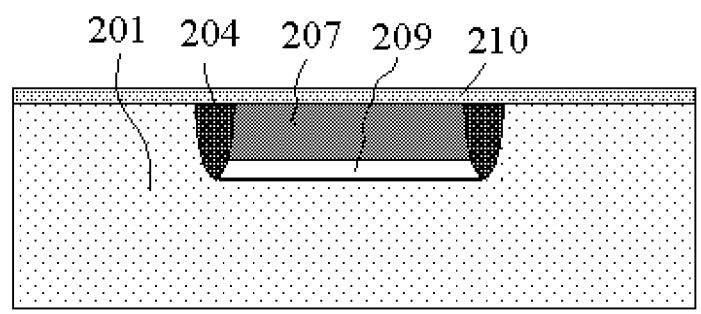
FIG. 7 illustrates the cross-sectional view showing a dielectric layer deposited on the surface of the silicon substrate including the surface of the porous silicon wall and the porous silicon layer and therefore the air-filled cavity under the porous silicon layer becomes a vacuum-cavity, which is step 6 for fabricating the vacuum-cavity-insulated flow sensor in accordance with the present invention.

Referring to FIG. 7, a dielectric layer (210) is formed on the whole surface of the silicon substrate (201) including the porous silicon wall (204) and the porous silicon layer (207). The dielectric layer is a RF sputtered silicon nitride or silicon oxide at a pressure ranging from 0.1 to 10 Pa. As an alternative the dielectric layer is a high vacuum LPCVD deposited silicon nitride or silicon oxide. During the process for forming the dielectric layer the cavity (209), the porous silicon wall (204) and the porous silicon layer (207) are drawn into vacuum. The pressure inside the cavity, the pores of the porous silicon wall and the porous silicon layer is nearly the same as the operation pressure of the RF sputter or LPCVD furnace. The thickness of the dielectric layer is preferred to be 2000 to 5000 angstroms. In order to reduce stress, annealing is performed at 950 degree C. for 30 min.

Figure 8:
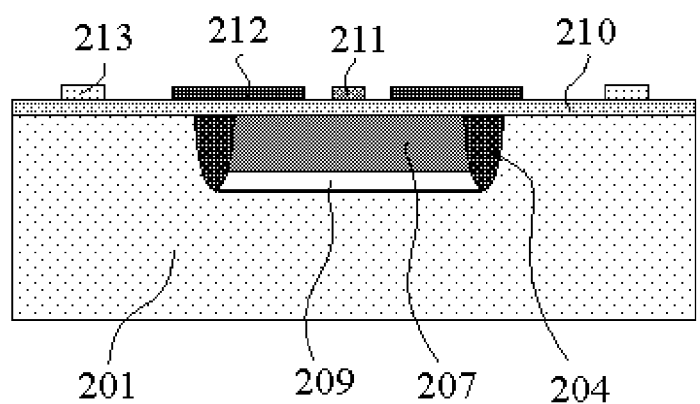
FIG. 8 illustrates the cross-sectional view showing a heating element formed on the dielectric layer, which is preferred to be polysilicon resistor and is positioned at the center region of the top of the suspended porous silicon membrane in accordance with one embodiment of the present invention.

Referring to FIG. 8, a heating element (211) is formed on the dielectric layer (210). The heating element is preferred to be polysilicon resistor. To do this a polysilicon layer is deposited by LPCVD on the surface of the dielectric layer (210). Then a photoresist process is followed to remove unwanted polysilicon. The resulted polysilicon resistor is disposed at the center of the porous silicon layer (membrane). As an alternative the heating element is a platinum resistor which is created by sputtering and lift-off process. Still as alternative the heating element is a nickel resistor which is created by electron beam evaporation or sputtering.

It is preferred that the temperature sensing elements (212) are two thermopiles each comprising 10 to 30 thermocouples. Each thermopile consists of p-type polysilicon or n-type polysilicon and aluminum or gold. The needed polysilicon portion is formed at the process for forming the polysilicon resistor. The needed aluminum portion or gold portion is formed at the process for forming conduction interconnection including conduction stripes (213) and bonding pads (not shown in the figure). As an alternative the temperature sensing elements are two platinum resistors which are created at the process for forming platinum resistor used for heating element. Still as alternative the temperature sensing elements are two nickel resistors which are created at the process for forming nickel resistor used for heating element. Still as alternative the temperature sensing elements are two polysilicon resistors which are created at the process for forming polysilicon resistor used for heating element.

While the present invention has been described with reference to particular embodiments of the vacuum-cavity-isolation flow sensors, it is obvious that other embodiments can be used without departing from the teachings herein. Obviously, many modifications and variations are possible in light of the teaching herein. It is therefore to be understood that within the scope of the appended claims, the present invention may be practiced other than as specifically described.

What is claimed is:

1. A vacuum-cavity-insulated flow sensor comprising:
   a single crystal silicon substrate;
   a porous silicon wall with numerous vacuum-pores therein which is created in said silicon substrate;
   a porous silicon membrane with numerous vacuum-pores therein which is created in said silicon substrate, surrounded and supported by said porous silicon wall;
   a cavity with a vacuum-space therein which is created beneath said porous silicon membrane and surrounded by said porous silicon wall;
   a dielectric layer deposited on the surface of said silicon substrate which includes the surface of said porous silicon wall and said porous silicon membrane;
   a heating element disposed laterally passing through at a middle of said porous silicon membrane;
   two temperature sensing elements disposed parallel with said heating element at two opposite sides thereof; and
   three pairs of metal conducting strips with three pairs of metal bonding pads disposed opposite to two sides of said porous silicon membrane for respectively connecting said heating element and said temperature sensing elements to an external circuit therefore.

2. A vacuum-cavity-insulated flow sensor according to claim 1 wherein said single crystal silicon substrate has a resistivity ranging from 0.1 to 0.001 ohm-cm.

3. A vacuum-cavity-insulated flow sensor according to claim 1 wherein said porous silicon wall has a thickness ranging from 20 to 60 microns and a width ranging from 30 to 60 microns.

4. A vacuum-cavity-insulated flow sensor according to claim 1 wherein said porous silicon membrane has a thickness ranging from 10 to 60 microns and a length ranging from 400 to 2000 microns.

5. A vacuum-cavity-insulated flow sensor according to claim 1 wherein said cavity has a thickness ranging from 1 to 20 microns and a length ranging from 400 to 2000 microns.

6. A vacuum-cavity-insulated flow sensor according to claim 1 wherein said vacuum means that the pressure is in the range from 0.001 to 10 Pa.

7. A vacuum-cavity-insulated flow sensor according to claim 1 wherein said dielectric layer is RF-sputtered silicon nitride layer or silicon oxide layer.

8. A vacuum-cavity-insulated flow sensor according to claim 1 wherein said dielectric layer is high vacuum LPCVD deposited silicon nitride layer or silicon oxide layer.

9. A vacuum-cavity-insulated flow sensor according to claim 1 wherein said heating element is a resistor.

10. A vacuum-cavity-insulated flow sensor according to claim 1 wherein said temperature sensing elements are thermopiles.

11. A vacuum-cavity-insulated flow sensor according to claim 1 wherein said temperature sensing elements are thermistors.

* * * * *